(12) United States Patent
Graham et al.

(10) Patent No.: US 9,419,636 B1
(45) Date of Patent: Aug. 16, 2016

(54) CLOCKED CURRENT-STEERING CIRCUIT FOR A DIGITAL-TO-ANALOG CONVERTER

(71) Applicant: Xilinx, Inc., San Jose, CA (US)

(72) Inventors: April M. Graham, Malahide (IE); Edward Cullen, Kildare (IE); Conrado K. Mesadri, Dublin (IE)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 14/682,868

(22) Filed: Apr. 9, 2015

(51) Int. Cl.
*H03M 1/66* (2006.01)
*H03M 1/00* (2006.01)
*H03K 3/012* (2006.01)
*H03M 1/74* (2006.01)

(52) U.S. Cl.
CPC .............. *H03M 1/002* (2013.01); *H03K 3/012* (2013.01); *H03M 1/66* (2013.01); *H03M 1/747* (2013.01)

(58) Field of Classification Search
CPC ....... H03M 1/002; H03M 1/747; H03M 1/66; H03M 1/742; H03K 3/012
USPC ........................................................ 341/144
See application file for complete search history.

(56) References Cited

U.S. PATENT DOCUMENTS

| 7,071,858 | B2* | 7/2006 | Pan | H03K 19/1738 327/359 |
| 7,629,910 | B2* | 12/2009 | Ramadoss | H03M 1/0881 341/136 |
| 7,924,199 | B2* | 4/2011 | Tokumaru | H03M 1/002 341/144 |
| 8,441,382 | B2* | 5/2013 | Mahajan | H03K 17/063 341/121 |

* cited by examiner

*Primary Examiner* — Brian Young
(74) *Attorney, Agent, or Firm* — Robert M. Brush

(57) ABSTRACT

In one example, a current steering circuit includes an output transistor pair responsive to a first gate bias voltage. The current steering circuit further includes a first switch comprising a first source-coupled transistor pair coupled to the output transistor pair and responsive to a first differential gate voltage, and a second switch comprising a second source-coupled transistor pair coupled to the output transistor pair and responsive to a second differential gate voltage. The current steering circuit further includes a current source configured to source a bias current. The current steering circuit further includes a third switch comprising a third source-coupled transistor pair coupled between the current source and each of the first switch and the second switch, the third source-coupled transistor pair responsive to a third differential gate voltage.

20 Claims, 7 Drawing Sheets

CLOCKED CURRENT-STEERING CIRCUIT FOR A DIGITAL-TO-ANALOG CONVERTER

TECHNICAL FIELD

Examples of the present disclosure generally relate to electronic circuits and, in particular, to a clocked current-steering circuit for a digital-to-analog converter (DAC).

BACKGROUND

Digital-to-analog conversion is the process of converting digital (binary) codes into a continuous range of analog signal levels. Digital codes can be converted into analog voltage, analog current, or analog charge signals using a digital-to-analog converter (DAC). An N-bit DAC provides discrete analog output levels for every one of $2^N$ digital words. DACs can be unipolar or bipolar. In the unipolar case, the analog output is zero when the digital input code is 000 . . . 00 and is at full-scale when the digital input code is 111 . . . 11. In the bipolar case, the analog output is at the midpoint of full-scale when the digital input code is 100 . . . 00. A DAC can have a parallel or serial architecture. Three popular parallel DAC architectures include the resistor string, ratioed current sources, and capacitor array architectures. Current-ratioed DACs (also known as current-steering DACs) comprise a large number of switched current sources. Conventionally, data is latched in a latch circuit and buffered by a driver circuit before driving a switched current source. Since a DAC can include a large number of current sources, it is important to optimize the architecture of the switched current sources and the circuitry driving such switched current sources in order to conserve resources (e.g., power, area, and the like).

SUMMARY

Techniques for providing a clocked current-steering circuit for a digital-to-analog converter (DAC) are described. In an example, a current steering circuit includes an output transistor pair responsive to a first gate bias voltage. The current steering circuit further includes a first switch comprising a first source-coupled transistor pair coupled to the output transistor pair and responsive to a first differential gate voltage, and a second switch comprising a second source-coupled transistor pair coupled to the output transistor pair and responsive to a second differential gate voltage. The current steering circuit further includes a current source configured to source a bias current. The current steering circuit further includes a third switch comprising a third source-coupled transistor pair coupled between the current source and each of the first switch and the second switch, the third source-coupled transistor pair responsive to a third differential gate voltage.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
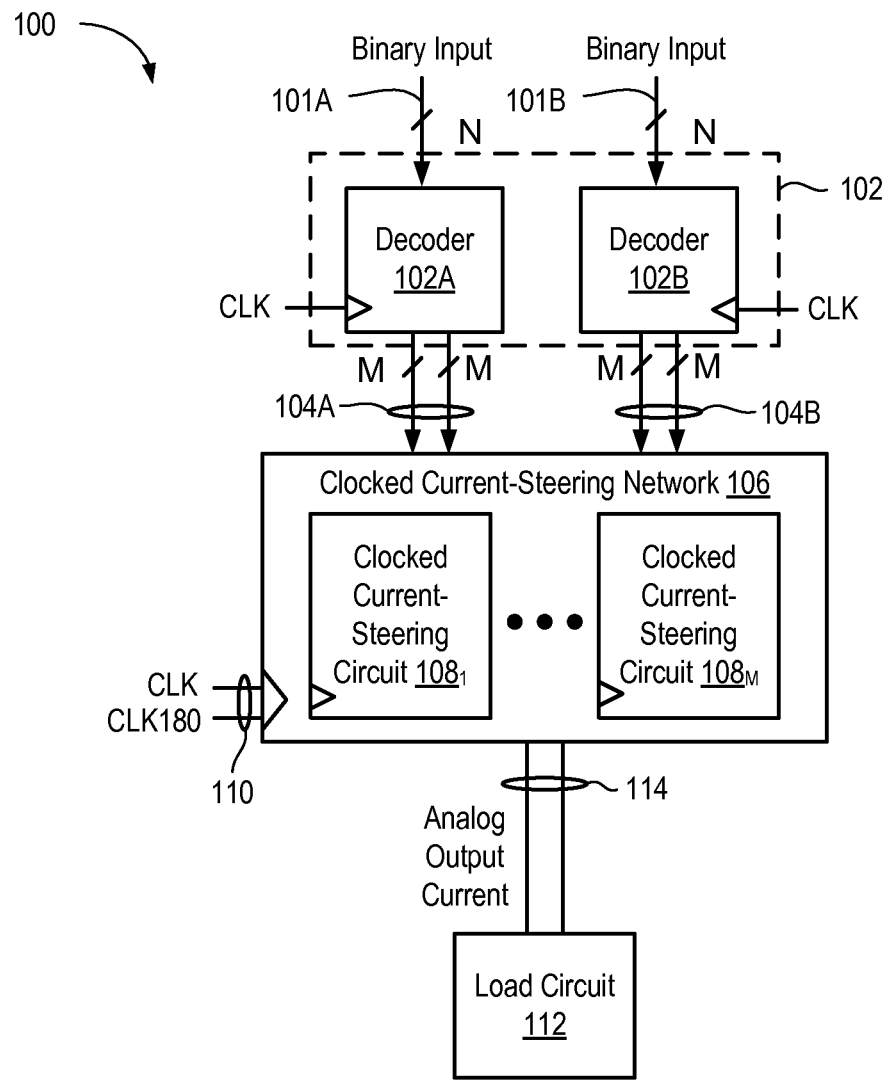
FIG. 1 is a block diagram depicting an example of a digital-to-analog converter (DAC).

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

Techniques for providing a clocked current-steering circuit for a digital-to-analog converter (DAC) are described. The clocked current-steering circuit includes a clock switch that switches based on a differential clock signal. The clock switch includes a source-coupled transistor pair coupled between a current source and each of a pair of data switches. The differential clock signal drives the gates of the clock switch to alternately steer current towards either the first data switch or the second data switch. The first data switch switches based on a differential data signal from a first data path (referred to as the data path A), and the second data switch switches based on a differential data signal from a second data path (referred to as the data path B). The differential data signals are derived from control codes generated in response to input binary data to be converted to analog output current. Each of the first and second data switches includes a source-coupled transistor pair coupled between the clock switch and a differential output. When the first data switch is selected by the clock switch, the first data switch steers current towards either a positive end or a negative end of the differential output based on the differential data signal on the first data path. Likewise, when the second data switch is selected by the clock switch, the second data switch steers current towards either the positive end or the negative end of the differential output based on the differential data signal on the second path. An output transistor pair can be coupled in cascode with the source-coupled transistor pair in each of the first and second data switches at the differential output.

A plurality of the clocked current-steering circuits can be combined to form a clocked current-steering network for a DAC. The clocked current-steering network can be employed with DACs having various architectures, including binary weighted, unary, or segmented architectures. The clocked current-steering circuits in the network each incorporates clocking into the circuit, obviating the need for a slave latch and driver between the data signal input and the data switches. By eliminating the slave latch and the driver for each clocked current-steering circuit, the clocked current-steering network exhibits reduced power consumption and reduced area, as compared to conventional current-steering architectures. Further, the clocked current-steering circuit switches on both the rising and falling edges of a clock signal, which multiplexes two data paths operating at the clock data rate. In the conventional current-steering architecture, mismatch contributions of the slave latch and driver together with the current steering circuit results in increased timing variation. Thus, eliminating the slave latch and driver circuits for each clocked current-steering circuit also reduces timing variation and increases performance of the clocked current-steering network.

FIG. 1 is a block diagram depicting an example of a digital-to-analog converter (DAC) 100. The DAC 100 includes a decoder 102, a clocked current-steering network 106, and a load circuit 112. The decoder 102 includes two data paths, referred to as "data path A" and "data path B". The decoder 102 includes a decoder circuit 102A that drives data path A, and a decoder circuit 102B that drives data path B. The decoder circuit 102A includes an input 101A for receiving binary codes to be converted into analog current levels ("binary input"). The input 101A has a width of N bits for receiving N-bit binary codes. A clock port of the decoder circuit 102A receives a clock signal "CLK". Likewise, the decoder circuit 102B includes an input 101B having a width of N bits for receiving N-bit binary codes.

The decoder circuit 102A and the decoder circuit 102B each output control codes to control the clocked current-steering network 106 based on the respective binary input. The decoder circuit 102A generates an output for an N-bit binary code on the data path A for each cycle of the clock signal CLK. Likewise, the decoder circuit 102B generates an output for an N-bit binary code on the data path B for each cycle of the clock signal CLK. The decoder circuit 102A includes an output 104A, and the decoder circuit 102B includes an output 104B. As described below, the switching-rate of the clocked current-steering network 106 is twice that of the clock signal CLK used by the decoder 102. Hence, in the example shown, the decoder 102 outputs two control codes for a respective two N-bit binary codes per cycle of the clock signal CLK (one of data path A and another on data path B), which are multiplexed by the clocked current-steering network 106 into an analog output current.

Each of the outputs 104A and 104B has a width of M bits for providing M-bit control codes to the clocked current-steering network 106. As described herein, the outputs 104A and 104B directly drive differential transistor switches in the clocked current-steering network 106. As such, the outputs 104A and 104B comprise differential outputs. Each of the M bit slices of the outputs 104A and 104B comprises a differential signal pair that includes two digital signals having a 180 degree difference in phase ("differential signal"). Each differential signal includes a "positive end" and a "negative end".

The clocked current-steering network 106 is coupled to the outputs 104A and 104B of the decoder 102. The clocked current-steering network 106 also includes a clock port configured to receive a differential clock signal 110. A positive end of the differential clock signal 110 includes the clock signal CLK, and a negative end of the differential clock signal 110 includes a clock signal CLK180 that is 180 degrees out-of-phase with the clock signal CLK. The clocked current-steering network 106 includes clocked current-steering circuits $108_1$ through $108_M$ (collectively referred to as "clocked current-steering circuits 108"). For brevity, the clocked current-steering circuits are also referred to herein as "current-steering circuits". Each of the current-steering circuits 108 includes a clock port configured to receive the differential clock signal 110. Each of the current-steering circuits 108 receives a respective bit slice of the output 104A and a respective bit slice of the output 104B.

In operation, each of the current-steering circuits 108 steers current to a positive end or a negative end of a differential output based on the control code data. For each edge of the clock signal CLK, the current-steering circuits 108 steer current based on the control code on the output 104A (data path A). For each edge of the clock signal CLK180, the current-steering circuits 108 steer current based on the control code on the output 104B (data path B). Thus, the current-steering circuits 108 generate two analog output current levels for each cycle of the clock signal CLK that drives the decoder 102 (e.g., one analog output current level for data path A and another analog output current level for data path B).

The clocked current-steering network 106 includes an analog output 114. The analog output 114 comprises a differential signal pair that includes two analog current signals ("analog output current"). The clocked current-steering network 106 generates an analog output current comprising the sum of the differential outputs of the current-steering circuits 108.

The load circuit 112 is coupled to the analog output 114. The load circuit 112 sources or sinks the analog output current depending on the type of transistors used in the current-steering circuits 108. Thus, from the perspective of the clocked current-steering network 106, the analog output current can be a positive current or a negative current. The load circuit 112 can include various types of circuits for sourcing or sinking the analog output current. For example, the load circuit 112 can include resistor loads that convert the analog output current to an analog output voltage. In another example, the load circuit 112 can include active circuit(s), such as current amplifier(s) for amplifying the analog output current or trans-resistance amplifier(s) for amplifying and converting the analog output current to an analog output voltage.

The DAC 100 is one example DAC in which the current-steering circuits 108 described herein can be used. The decoder 102 can employ various decoding schemes, including binary weighted coding, thermometer coding (unary weighted), or a combination thereof (e.g., a segmented DAC). Regardless of the input and particular coding used, the decoder 102 generally outputs two data paths that directly drive the current-steering circuits 108 in the clocked current-steering network 106.

Figure 2:
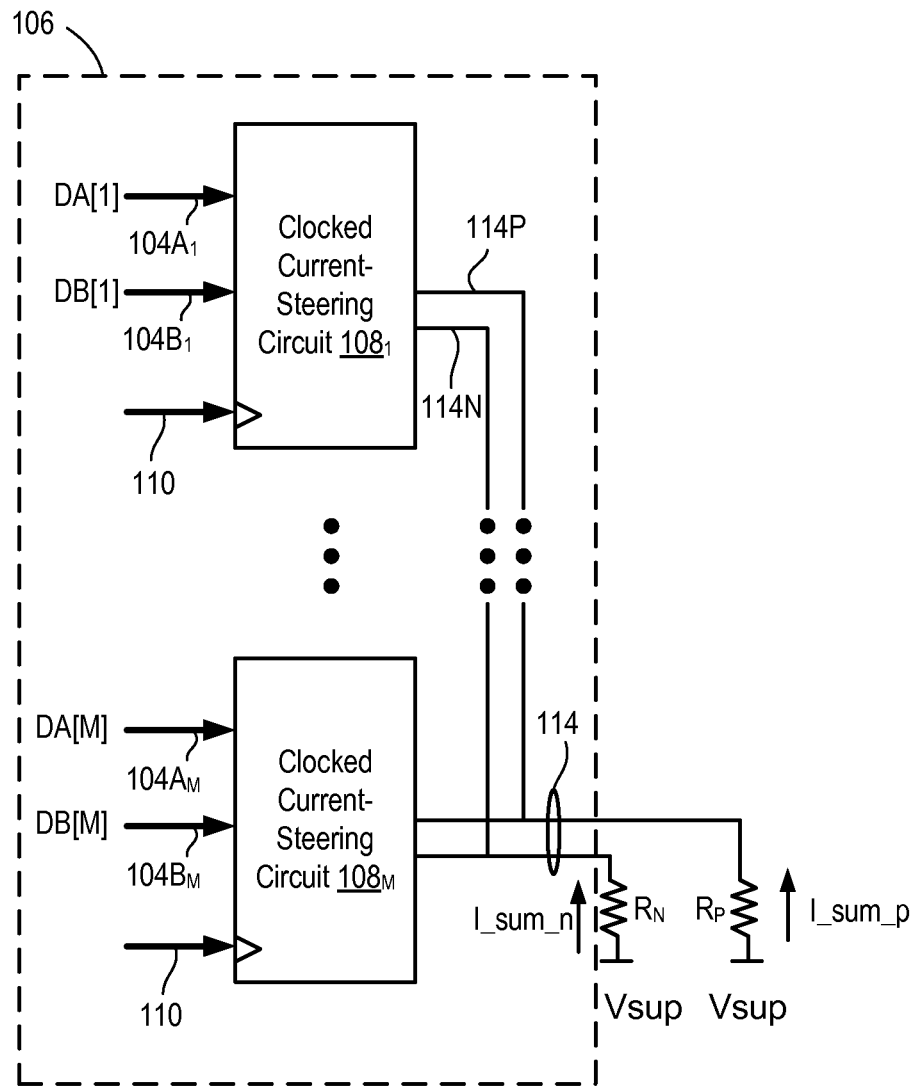
FIG. 2 is a block diagram depicting an example of a clocked current-steering network that can be used in a DAC.

FIG. 2 is a block diagram depicting an example of a clocked current-steering network 106 that can be used in a DAC, such as the DAC 100 shown in FIG. 1. As described above, the clocked current-steering network 106 comprises the clocked current-steering circuits $108_1$ through $108_M$. The clocked current-steering circuit $108_1$ receives the first bit slice of each of the outputs 104A and 104B (referred to as "DA[1]" for the first bit of data path A and "DB[1]" for the first bit of data path B). In general, the kth current-steering circuit $108_k$ receives the kth bit slice of each of the outputs 104A and 104B (e.g., DA[k] and DB[k]). Each bit slice DA[k] and DB[k] is a differential signal comprising a positive end and a negative end (the positive and negative ends are shown collectively in FIG. 2). Each of the current-steering circuits 108 also receives the differential clock signal 110 having a positive end (with the clock signal CLK) and a negative end (with the clock signal CLK180). The positive and negative ends of the differential clock signal 110 are shown collectively in FIG. 2.

Each of the current-steering circuits 108 is switched to steer current to either a positive end 114P or negative end 114N of the analog output 114. The switching is based on the control code input (DA[k] and DB[k]) and the clock input (CLK and CLK180). In the example, the load circuit 112 comprises a resistor $R_P$ coupled to the positive end 114P, and a resistor $R_N$ coupled to the negative end 114N. In the example shown, the resistors $R_P$ and $R_N$ are coupled to a supply voltage (Vsup) and the clocked current-steering network 106 sinks a current I_sum_n on the negative end 114N and a current I_sum_p on the positive end 114P of the analog output 114. In another example, the resistors $R_P$ and $R_N$ can be coupled to a reference voltage (e.g., electrical ground) and the clocked current-steering network 106 can supply the current I_sum_n and the current I_sum_p.

Figure 3:
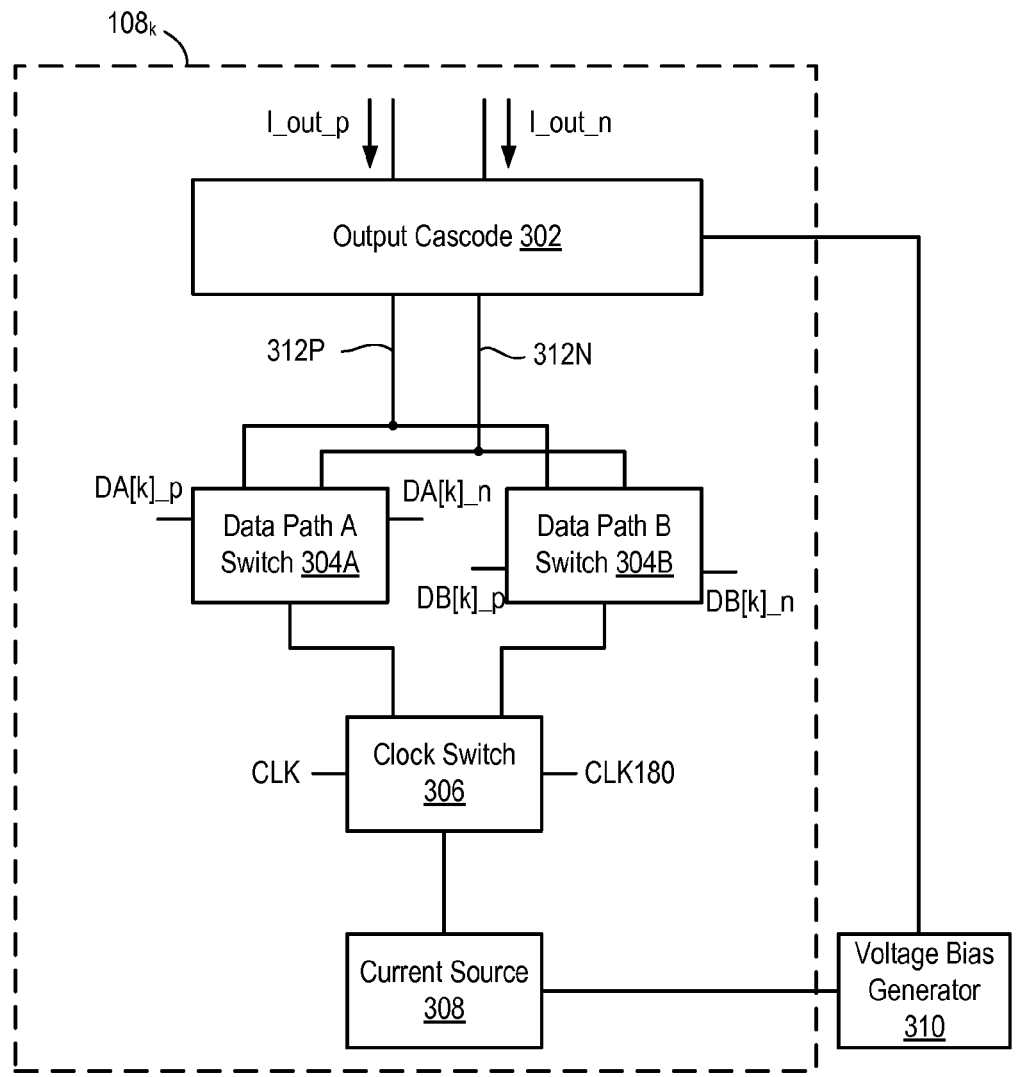
FIG. 3 is a block diagram depicting an example of a current-steering circuit in the clocked current-steering network of FIG. 2.

FIG. 3 is a block diagram depicting an example of a current-steering circuit $108_k$ used in the clocked current-steering network 106 shown in FIG. 2 (where k∈{1 ... M}). The current-steering circuit $108_k$ comprises an output cascode 302, a data path A switch 304A, a data path B switch 304B, a clock switch 306, and a current source 308. The output cascode 302 and the current source 308 receive bias voltage from a voltage bias generator 310. The data phase A switch 304A, the data path B switch 304B, and the clock switch 306 each comprise a differential switch that switches between two states based on a differential input.

In operation, the clock switch 306 steers current to either the data path A switch 304A or the data path B switch 304B based on the difference between clock signal CLK the clock signal CLK180. When selected by the clock switch 306, the data path A switch 304A steers current to either a positive end 312P or a negative end 312N of a differential output 312 based on the difference between the DA[k]_p signal and the DA[k]_n signal. Likewise, when selected by the clock switch 306, the data path B switch 304B steers current to either the positive end 312P or the negative end 312N based on the difference between the DB[k]_p and DB[k]_n signals. The output cascode 302 is biased to conduct output current I_out_p on the positive end 312P and I_out_n on the negative end 312N of the differential output 312. The output cascode 302 shields the analog output 114 from parasitic capacitance of the current-steering circuit 108.

The current-steering circuit $108_k$ incorporates clocking into the circuit, obviating the need for a slave latch and driver to couple the data signals to the data switches. By eliminating the slave latch and the driver for each current-steering circuit $108_k$, the clocked current-steering network 106 exhibits reduced power consumption as compared to conventional current-steering architectures. In the conventional current-steering architecture, mismatch contributions of the slave latch and driver together with the current steering circuit results in increased timing variation. Thus, eliminating the slave latch and driver circuits for each current-steering circuit $108_k$ also reduces timing variation (e.g., increases performance) in the clocked current-steering network 106. Depending on slave latch and driver implementation, the current-steering circuit $108_k$ can also exhibit reduced implementation area with respect to the conventional current-steering architecture.

Further, the current-steering circuit $108_k$ switches on both the rising and falling edges of the clock signal CLK, which multiplexes two data paths operating at CLK data rate. In this manner, use of the current-steering circuits 108 doubles the effective speed of the DAC as compared to using conventional current steering circuits driven by slave latches. A conventional slave latch only switches on one edge of the clock signal.

Figure 4A:
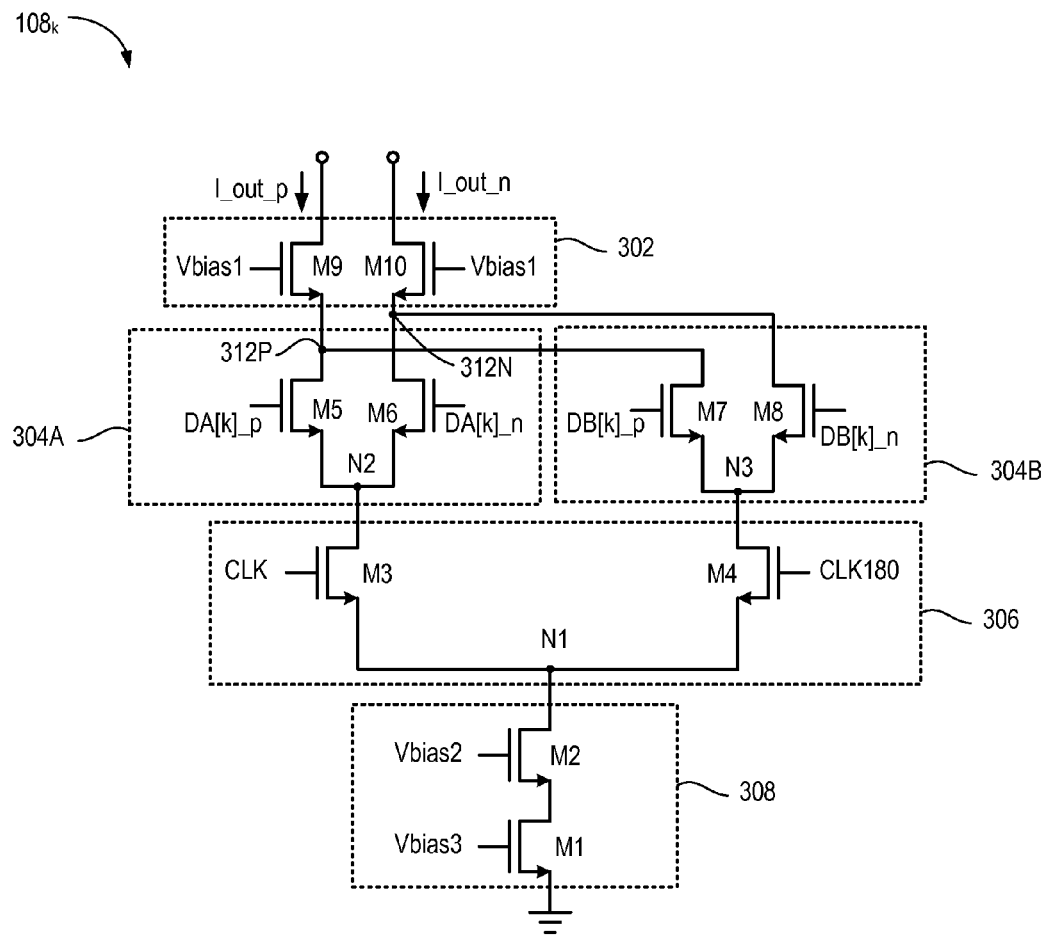
FIG. 4A is a schematic diagram depicting a more detailed example of the current steering circuit shown in FIG. 3.

FIG. 4A is a schematic diagram depicting a more detailed example of the current-steering circuit $108_k$. In general, the current-steering circuit $108_k$ comprises a plurality of n-channel field effect transistors (FETs), such as n-type metal oxide semiconductor FETs (n-type MOSFETS, also referred to as NMOS transistors) or the like. In the example, the current source 308 comprises transistors M1 and M2 coupled in cascode. A source of the transistor M1 is coupled to a reference voltage (e.g., electrical ground), and a drain of the transistor M1 is coupled to a source of the transistor M2. A drain of the transistor M2 is coupled to a node N1. A gate of the transistor M1 is configured to receive a bias voltage Vbias3. A gate of the transistor M2 is configured to receive a bias voltage Vbias2. The bias voltages Vbias2 and Vbias3 are configured to keep the transistors M1 and M2 in the saturation region. A desired bias current (drain current) can be obtained by varying the width of the transistor M1 and adjusting the value of Vbias3 (e.g., the amount of overdrive voltage applied to the gate of transistor M1). In the example shown, the current source 308 comprises a cascode current source, where the cascode transistor M2 increases source impedance, as is known in the art.

The clock switch 306 comprises a source-coupled transistor pair that includes the transistor M3 and the transistor M4. The sources of the transistors M3 and M4 are coupled to the node N1, which is in turn coupled to the current source 308. The drain of the transistor M3 is coupled to a node N2, and the drain of the transistor M4 is coupled to a node N3. A gate of the transistor M3 is coupled to receive the clock signal CLK, and the gate of the transistor M4 is coupled to receive the clock signal CLK180.

The data path A switch 304A comprises a source-coupled transistor pair that includes the transistor M5 and the transistor M6. The sources of the transistors M5 and M6 are coupled to the node N2, which is in turn coupled to the drain of the transistor M3. The drain of the transistor M5 is coupled to the positive end 312P of the differential output 312, and the drain of the transistor M6 is coupled to the negative end 312N of the differential output 312. A gate of the transistor M5 is coupled to receive the data signal DA[k]_p (positive end of the data signal DA[k] for the kth bit slice). A gate of the transistor M6 is coupled to receive the data signal DA[k]_n (negative end of the data signal DA[k] for the kth bit slice).

The data path B switch 304B comprises a source-coupled transistor pair that includes the transistor M7 and the transistor M8. The sources of the transistors M7 and M8 are coupled to the node N3, which is in turn coupled to the drain of the transistor M4. The drain of the transistor M7 is coupled to the positive end 312P of the differential output 312, and the drain of the transistor M8 is coupled to the negative end 312N of the differential output 312. A gate of the transistor M7 is coupled to receive the data signal DB[k]_p (positive end of the data signal DB[k] for the kth bit slice). A gate of the transistor M8 is coupled to receive the data signal DB[k]_n (negative end of the data signal DB[k] for the kth bit slice).

The output cascode 302 comprises an output transistor pair that includes the transistor M9 and the transistor M10. A source of the transistor M9 is coupled to the positive end 312P of the differential output 312, and source of the transistor M10 is coupled to the negative end 312N of the differential output 312. Gates of the transistors M9 and M10 are coupled to receive a bias voltage Vbias1. The drain current of the transistor M9 is the output current I_out_p of on the positive end 312P of the differential output 312, and the drain current of the transistor M10 is the output current I_out_n on the negative end 312N of the differential output 312.

In operation, when the difference between CLK and CLK180 is positive, the transistor M3 conducts and steers the bias current to the data path A switch 304A, while the transistor M4 transitions to cutoff. The difference between CLK and CLK180 is positive at the leading edge of the clock signal CLK. Conversely, when the difference between CLK and CLK180 is negative, the transistor M4 conducts and steers the bias current to the data path B switch 304B, while the transistor M3 transitions to cutoff. The difference between CLK and CLK180 is negative at the trailing edge of the clock signal CLK (the leading edge of the clock signal CLK180). Thus, the current-steering circuit 108 switches on both the leading and trailing edges of the clock signal CLK.

The data phase A switch 304A operates in a similar fashion when selected by the clock switch. When the difference between DA[k]_p and DA[k]_n is positive, the transistor M5 conducts and steers the bias current to the positive end 312P, while the transistor M6 transitions to cutoff. Conversely, when the difference between DA[k]_p and DA[k]_n is negative, the transistor M6 conducts and steers the bias current to the negative end 312N, while the transistor M5 transitions to cutoff.

The data path B switch 304B operates in a similar fashion when selected by the clock switch. When the difference between DB[k]_p and DB[k]_n is positive, the transistor M7 conducts and steers the bias current to the positive end 312P, while the transistor M8 transitions to cutoff. Conversely, when the difference between DB[k]_p and DB[k]_n is negative, the transistor M8 conducts and steers the bias current to the negative end 312N, while the transistor M7 transitions to cutoff.

The cascode transistors M9 and M10 can be biased to remain in the saturation region. The cascode transistors M9 and M10 increase output impedance of the current-steering circuit $108_k$.

While a specific configuration of the current source 308 is shown, those skilled in the art will appreciate that other current source configurations can be used, such as a single FET, a current mirror, a cascode current mirror, or the like. Further, while the current-steering circuit $108_k$ is described as being implemented using NMOS transistors, those skilled in the art will appreciate that the current-steering circuit $108_k$ can be similarly configured using p-channel FETs (e.g., PMOS transistors). As described above, when NMOS transistors are employed, the current-steering circuit $108_k$ sinks current from the load circuit. In an example where PMOS transistors are used, the current-steering circuit $108_k$ supplies current to the load circuit.

Figure 4B:
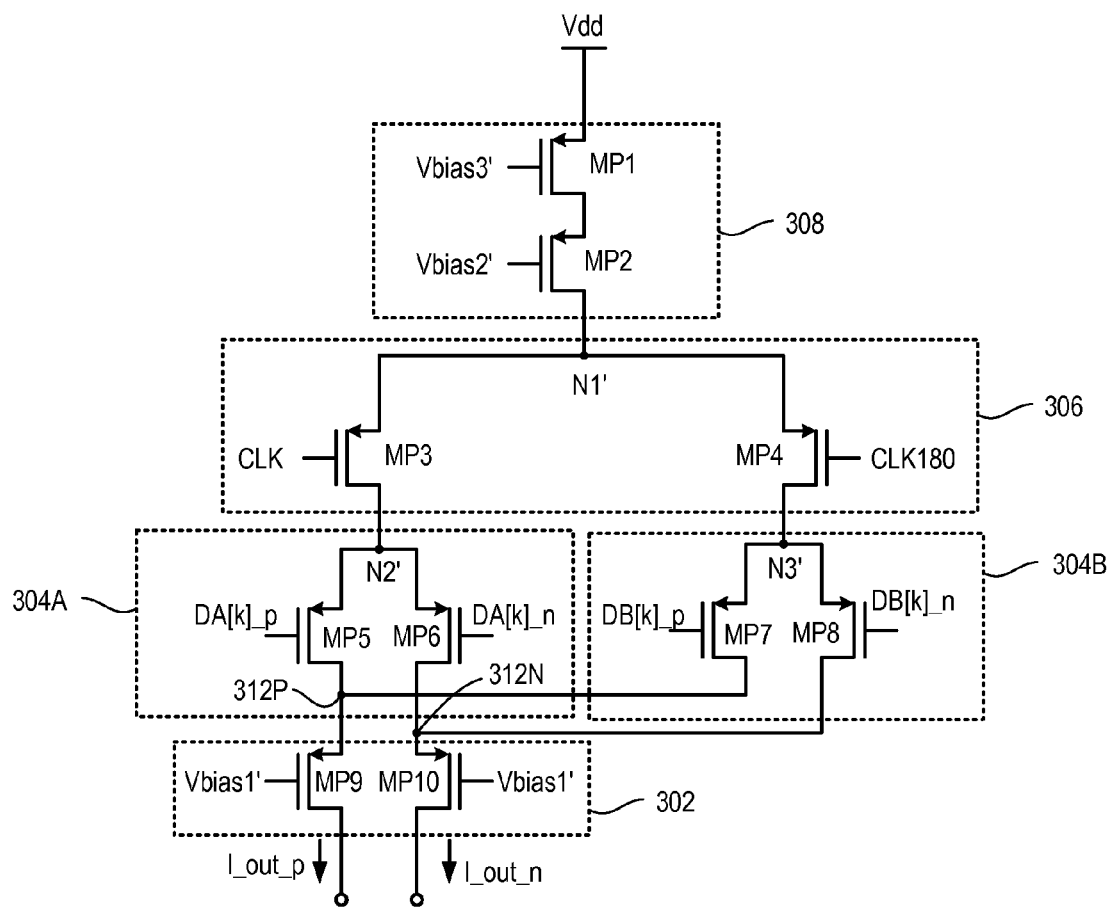
FIG. 4B is a schematic diagram depicting another example of the current steering circuit shown in FIG. 3.

In particular, FIG. 4B is a schematic diagram depicting another example of the current-steering circuit $108_k$. In general, the current-steering circuit $108_k$ comprises a plurality of p-channel field effect transistors (FETs), such as p-type metal oxide semiconductor FETs (p-type MOSFETS, also referred to as PMOS transistors) or the like. Each of NMOS transistors M1-M10 can be replaced by corresponding PMOS transistors MP1-MP10 as shown in FIG. 4B. Vbias1-Vbias3 can be replaced by Vbias1'-through Vbias3' suitable for driving PMOS transistors. Otherwise, the PMOS implementation of the current-steering circuit $108_k$ operates similar to the NMOS implementation described above. Rather than sinking current at the differential output, the PMOS implementation supplies current at the differential output.

Figure 5:
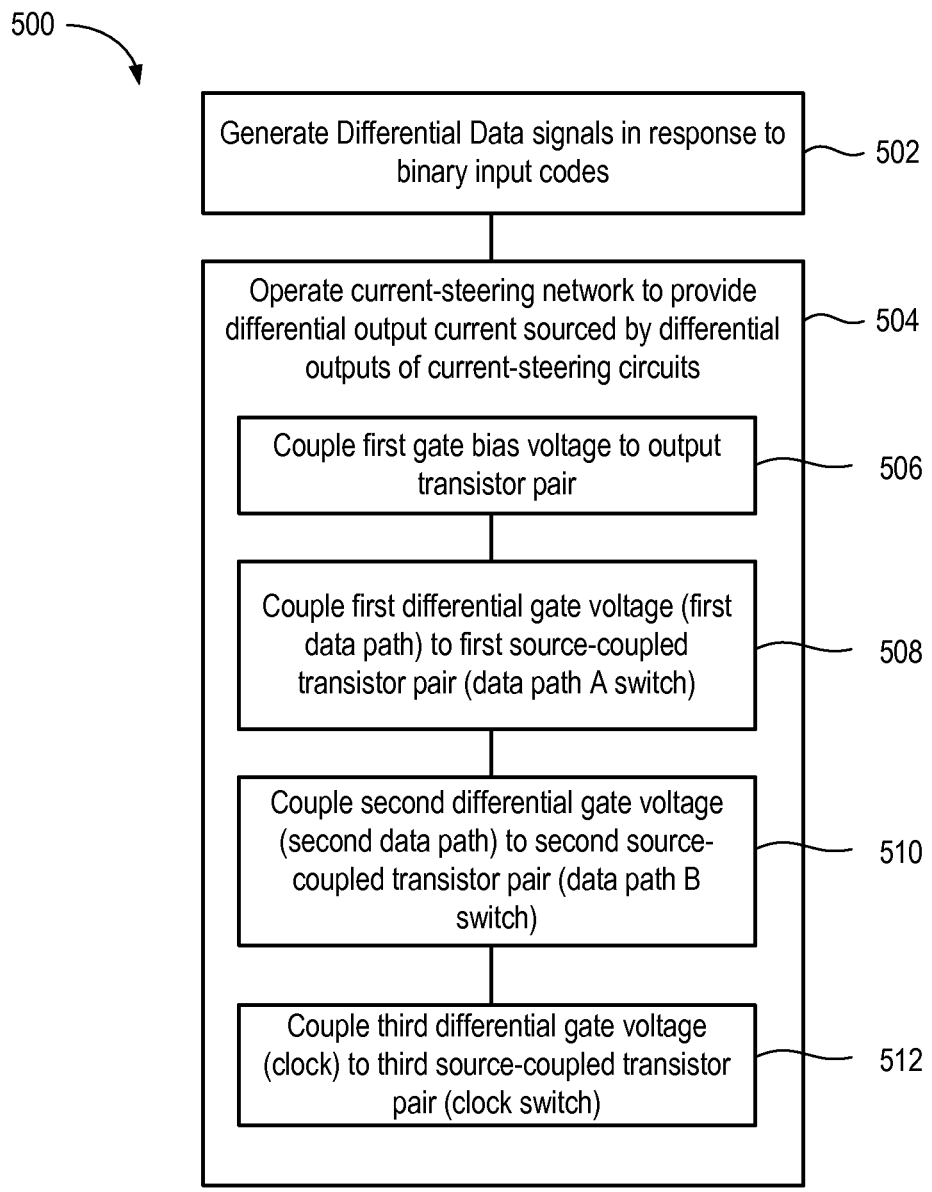
FIG. 5 is a flow diagram depicting an example of a method of digital-to-analog conversion.

FIG. 5 is a flow diagram depicting an example of a method 500 of digital-to-analog conversion. The method 500 may be understood with reference to FIGS. 1 through 4 above. The method 500 begins at block 502, where the decoder 102 generates differential data signals in response to binary input codes. As discussed above, the differential data signals are provided on two different paths (data path A and data path B). At block 504, the clocked current-steering network 106 is operated to provide differential output current sourced by differential outputs of current-steering circuits 108. The block 504 can include blocks 506 through 512. At block 506, a first gate bias voltage (Vbias1) is coupled to an output transistor pair (e.g., transistors M9 and M10 in output cascode 302). At block 508, a first differential gate voltage (signals DA_p and DA_n on data path A) is coupled to a first source-coupled transistor pair (transistors M5 and M6 in data path A switch 304A). At block 510, a second differential gate voltage (signals DB_p and DB_n on data path B) is coupled to a second source-coupled transistor pair (e.g., transistors M7 and M8 in data path B switch 304B). At block 512, a third differential gate voltage (signals CLK and CLK180) is coupled to a third source-coupled transistor pair (transistors M3 and M4 is clock switch 306).

Figure 6:
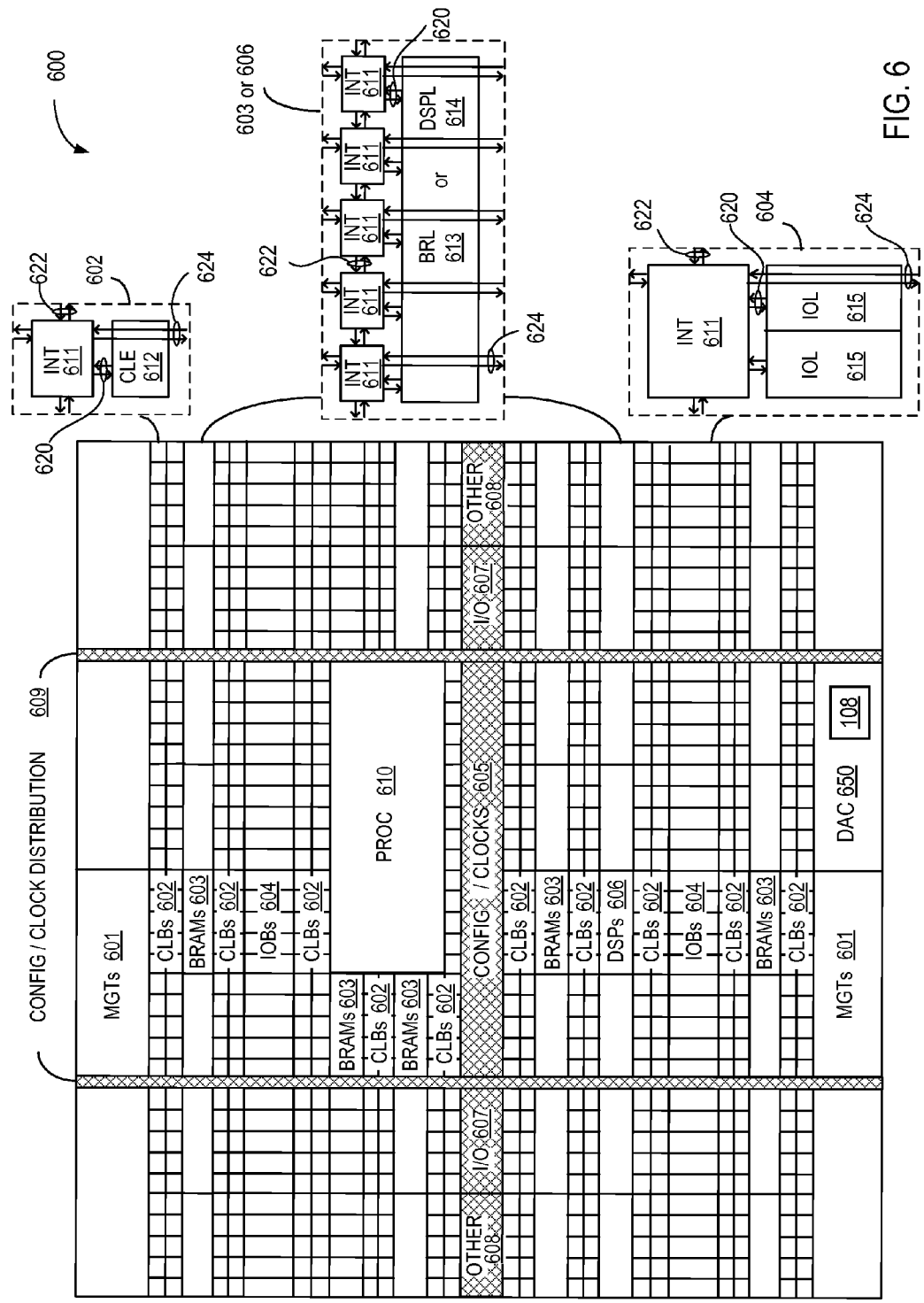
FIG. 6 illustrates an example architecture of an FPGA having a DAC with current-steering circuits.

The current-steering circuits 108 described herein can be used in various DAC applications, including in DACs on various types of integrated circuits. For example, the current-steering circuits 108 can be used in a DAC on a programmable integrated circuit, such as a field programmable gate array (FPGA). FIG. 6 illustrates an example architecture of an FPGA 600 that includes a large number of different programmable tiles including multi-gigabit transceivers ("MGTs") 601, configurable logic blocks ("CLBs") 602, random access memory blocks ("BRAMs") 603, input/output blocks ("IOBs") 604, configuration and clocking logic ("CONFIG/CLOCKS") 605, digital signal processing blocks ("DSPs") 606, specialized input/output blocks ("I/O") 607 (e.g., configuration ports and clock ports), and other programmable logic 608 such as digital clock managers, analog-to-digital converters, system monitoring logic, and so forth. Some FPGAs also include dedicated processor blocks ("PROC") 610.

In some FPGAs, each programmable tile can include at least one programmable interconnect element ("INT") 611 having connections to input and output terminals 620 of a programmable logic element within the same tile, as shown by examples included at the top of FIG. 6. Each programmable interconnect element 611 can also include connections to interconnect segments 622 of adjacent programmable interconnect element(s) in the same tile or other tile(s). Each programmable interconnect element 611 can also include connections to interconnect segments 624 of general routing resources between logic blocks (not shown). The general routing resources can include routing channels between logic blocks (not shown) comprising tracks of interconnect segments (e.g., interconnect segments 624) and switch blocks (not shown) for connecting interconnect segments. The interconnect segments of the general routing resources (e.g., interconnect segments 624) can span one or more logic blocks. The programmable interconnect elements 611 taken together with the general routing resources implement a programmable interconnect structure ("programmable interconnect") for the illustrated FPGA.

In an example implementation, a CLB 602 can include a configurable logic element ("CLE") 612 that can be programmed to implement user logic plus a single programmable interconnect element ("INT") 611. A BRAM 603 can include a BRAM logic element ("BRL") 613 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 606 can include a DSP logic element ("DSPL") 614 in addition to an appropriate number of programmable interconnect elements. An 10B 604 can include, for example, two instances of an input/output logic element ("IOL") 615 in addition to one instance of the programmable interconnect element 611. As will be clear to those of skill in the art, the actual I/O pads connected, for example, to the I/O logic element 615 typically are not confined to the area of the input/output logic element 615.

In the pictured example, a horizontal area near the center of the die (shown in FIG. 6) is used for configuration, clock, and other control logic. Vertical columns 609 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 610 spans several columns of CLBs and BRAMs. The processor block 610 can include various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 6 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements. The FPGA 600 can include a DAC 650 having current-steering circuits 108.

While the foregoing is directed to specific examples, other and further examples may be devised without departing from the basic scope thereof, and the scope thereof is determined by the claims that follow.

What is claimed is:

1. A current steering circuit, comprising:
   an output transistor pair responsive to a first gate bias voltage;
   a first switch comprising a first source-coupled transistor pair coupled to the output transistor pair and responsive to a first differential gate voltage;
   a second switch comprising a second source-coupled transistor pair coupled to the output transistor pair and responsive to a second differential gate voltage;
   a current source configured to source a bias current; and
   a third switch comprising a third source-coupled transistor pair coupled between the current source and each of the first switch and the second switch, the third source-coupled transistor pair responsive to a third differential gate voltage.

2. The current steering circuit of claim 1, wherein the first differential gate voltage comprises a first phase of a differential data signal, the second differential gate voltage comprises a second phase of the differential data signal, and the third gate voltage comprises a differential clock signal.

3. The current steering circuit of claim 2, wherein each end of the differential data signal comprises a digital signal alternating between two voltage states.

4. The current steering circuit of claim 1, wherein the current source comprises a first current source transistor coupled in cascode with a second current source transistor, the first current source transistor responsive to a second gate bias voltage and the second current source transistor responsive to a third gate bias voltage.

5. The current steering circuit of claim 1, wherein the transistors in each of the output transistor pair, the first switch, the second switch, and the third switch comprise n-channel metal oxide field effect transistors (MOSFETs).

6. The current steering circuit of claim 1, wherein the transistors in each of the output transistor pair, the first switch, the second switch, and the third switch comprise p-channel metal oxide field effect transistors (MOSFETs).

7. The current steering circuit of claim 1, wherein the first gate bias voltage is configured to maintain each transistor in the output transistor pair in a saturation mode based on a load circuit coupled to the output transistor pair.

8. A digital-to-analog converter (DAC), comprising:
   a decoder configured to output a differential data signal in response to binary input codes; and
   a current-steering network coupled to the decoder and configured to provide a differential output current, the differential output current sourced by differential outputs of a plurality of current-steering circuits, each of the plurality of current steering circuits comprising:
      an output transistor pair responsive to a first gate bias voltage and configured to provide a respective differential output;
      a first switch comprising a first source-coupled transistor pair coupled to the output transistor pair and responsive to a first differential gate voltage;
      a second switch comprising a second source-coupled transistor pair coupled to the output transistor pair and responsive to a second differential gate voltage;
      a current source configured to source a bias current; and
      a third switch comprising a third source-coupled transistor pair coupled between the current source and each of the first switch and the second switch, the third source-coupled transistor pair responsive to a third differential gate voltage.

9. The DAC claim 8, wherein, for each of the plurality of current steering circuits, the first differential gate voltage comprises a first phase of one of the differential data signals, the second differential gate voltage comprises a second phase of the one of the differential data signals, and the third gate voltage comprises a differential clock signal.

10. The current steering circuit of claim 9, wherein each end of the differential data signal comprises a digital signal alternating between two voltage states.

11. The DAC of claim 8, wherein the current source in each of the plurality of current steering circuits comprises a first current source transistor coupled in cascode with a second current source transistor, the first current source transistor responsive to a second gate bias voltage and the second current source transistor responsive to a third gate bias voltage.

12. The DAC of claim 8, wherein the transistors in each of the output transistor pair, the first switch, the second switch, and the third switch in each of the plurality of current steering circuits comprise n-channel metal oxide field effect transistors (MOSFETs).

13. The DAC of claim 8, wherein the transistors in each of the output transistor pair, the first switch, the second switch, and the third switch in each of the plurality of current steering circuits comprise p-channel metal oxide field effect transistors (MOSFETs).

14. The DAC of claim 8, wherein, for each of the plurality of current steering circuits, the first gate bias voltage is configured to maintain each transistor in the output transistor pair in a saturation mode based on a load circuit coupled to the output transistor pair.

15. The DAC of claim 8, further comprising a load circuit coupled to current steering network.

16. A method of digital-to-analog conversion, comprising:
   generating differential data signals in response to binary input codes;
   operating a current steering network to provide a differential output current sourced by differential outputs of a plurality of current-steering circuits, where each of the plurality of current-steering circuits is operated by:
      coupling a first gate bias voltage to an output transistor pair;
      coupling a first differential gate voltage to a first source-coupled transistor pair coupled to the output transistor pair;
      coupling a second differential gate voltage to a second source-coupled transistor pair coupled to the output transistor pair;
      coupling a third differential gate voltage to a third source-coupled transistor pair to steer a bias current between the first source-coupled transistor pair and the second source-coupled transistor pair.

17. The method of claim 16, wherein, for each of the plurality of current steering circuits, the first differential gate voltage comprises a first phase of one of the differential data signals, the second differential gate voltage comprises a second phase of the one of the differential data signals, and the third gate voltage comprises a differential clock signal.

18. The method of claim 17, wherein each end of the differential data signal comprises a digital signal alternating between two voltage states.

19. The method of claim 16, wherein the transistors in each of the output transistor pair, the first switch, the second switch, and the third switch in each of the plurality of current steering circuits comprise n-channel metal oxide field effect transistors (MOSFETs).

20. The method of claim 16, wherein, for each of the plurality of current steering circuits, the first gate bias voltage is configured to maintain each transistor in the output transistor pair in a saturation mode based on a load circuit coupled to the output transistor pair.

\* \* \* \* \*